(12) United States Patent
Biebl et al.

(10) Patent No.: US 6,375,340 B1
(45) Date of Patent: Apr. 23, 2002

(54) LED COMPONENT GROUP WITH HEAT DISSIPATING SUPPORT

(75) Inventors: Alois Biebl, St. Johann; Guenther Hirschmann, Munich, both of (DE)

(73) Assignee: Patent-Treuhand-Gesellschaft fuer Elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/604,423

(22) Filed: Jun. 26, 2000

(30) Foreign Application Priority Data

Jul. 8, 1999 (DE) .......................... 199 31 689

(51) Int. Cl.[7] ............................. F21Y 29/01
(52) U.S. Cl. ............... 362/294; 362/249; 362/373
(58) Field of Search ................. 362/487, 543, 362/545, 547, 249, 294, 373, 800

(56) References Cited

U.S. PATENT DOCUMENTS

| | | | | |
|---|---|---|---|---|
| 4,729,076 A | * | 3/1988 | Masami et al. | 362/235 |
| 5,038,255 A | * | 8/1991 | Nishihashi et al. | 362/547 |
| 5,390,093 A | * | 2/1995 | Himeno et al. | 362/249 |
| 5,528,474 A | * | 6/1996 | Roney et al. | 362/249 |
| 5,632,551 A | * | 5/1997 | Roney et al. | 362/249 |
| 5,657,159 A | * | 8/1997 | Natori | 359/448 |
| 5,782,555 A | * | 7/1998 | Hochstein | 362/373 |
| 5,785,418 A | * | 7/1998 | Hochstein | 362/373 |
| 5,835,269 A | * | 11/1998 | Natori | 359/448 |
| 5,857,767 A | * | 1/1999 | Hochstein | 362/294 |
| 6,045,240 A | * | 4/2000 | Hochstein | 362/294 |

FOREIGN PATENT DOCUMENTS

| | | |
|---|---|---|
| DE | 195 28 459 | 2/1997 |
| DE | 196 21 124 | 11/1997 |
| EP | A 900 971 | 3/1999 |
| EP | 921 568 | 6/1999 |
| WO | 99-07023 | 2/1999 |

* cited by examiner

*Primary Examiner*—Sandra O'Shea
*Assistant Examiner*—Ismael Negron
(74) *Attorney, Agent, or Firm*—Carlo S. Bessone

(57) ABSTRACT

An optoelectronic component group has at least two LEDs (2) which are mounted on a support (3). The support is composed of a material having a thermal conductivity of better than 1.5 W/K×m, for example ceramic or composite material.

18 Claims, 1 Drawing Sheet

LED COMPONENT GROUP WITH HEAT DISSIPATING SUPPORT

TECHNICAL FIELD

The invention relates to an optoelectronic component group. This concerns, in particular, LED arrays which are arranged in a planar manner, for example surface lighting luminaires.

PRIOR ART

WO 99/07023 has already disclosed an optoelectronic component group in which a chip support has external connecting parts for the purpose of heat dissipation. However, this arrangement is very complicated and expensive and takes up a lot of space.

EP-A 99 100 352.6 has disclosed a surface lighting luminaire with a common support on which a plurality of LEDs form a planar array. In EP-A 900 971, the support used is a glass plate on which conductor tracks are also fitted.

SUMMARY OF THE INVENTION

The object of the present invention is to provide an optoelectronic component group which realizes good heat dissipation in a simple, cost-saving and space-saving manner.

Since LEDs heat up, care must be taken to ensure that the thermal load is kept as small as possible. This problem arises particularly when a plurality of LEDs are combined to form a section, as in the case of a lamp for example, or an array, as in the case of a surface lighting luminaire for example. To date, care has always had to be taken to ensure that the packing density of the LEDs is not chosen to be too close. The minimum distance that has been customary heretofore is 8 to 10 mm (in other words about 1 LED/cm$^2$), in order to keep the extent of mutual heating as small as possible. This is because excessively great heating, beyond the junction temperature of the LED chip, leads to shortening of the service life through to destruction. The previous relatively large minimum distance guarantees that each LED only has to cope with its inherent heat. In order nevertheless to produce a homogeneously illuminated surface, reflectors have been used heretofore. In addition, a diffusing screen is applied as a covering. These parts necessitate additional costs.

According to the invention, a material which has a good heat dissipation (better than the conventional printed circuit board material such as FR 1 to 4 or CEM 1) is now used as the support for the component group containing LEDs. In particular, a ceramic substrate of the kind already known per se in the semiconductor industry (based on aluminium oxide or else AlN), non-conducting cermet or composite material is suitable for this purpose. This includes both a material mixed from two components (for example epoxy resin with inorganic filling material), and a material with a layer structure (for example ceramic as upper layer (aluminium oxide) and metal (aluminium) as lower layer).

This means that it is now possible to dispense partly or even entirely with reflectors, depending on the desired degree of homogeneity. With a relatively large distance (3 to 5 mm) between the LEDs, it is advantageous also to continue to use a diffusing screen as a covering. A covering is in any case advisable or, under certain circumstances, even dictated by regulation, depending on the application. However, the diffusing screen is no longer absolutely necessary, since the distance between the LEDs can, owing to the good heat dissipation, be chosen to be very small, in particular below 2 mm, down to values of about 1 mm.

Overall, according to the invention, the heat dissipation is essentially effected by way of the support material. The packing density of the LEDs can thereby be increased. Instead of 1 LED/cm$^2$, packing densities of typically up to 4 LED/cm$^2$ or higher are now possible.

In detail, the present invention relates to an optoelectronic component group which is mounted on a support and which comprises at least two adjacent LEDs at a prescribed distance (a), and also associated connecting lines, where the support is composed of a material having a thermal conductivity of better than 1 W/K×m, in particular of at least 1.5 W/K×m.

Preferably, the support is composed of a material which can be populated by means of SMD technology. In particular, the support is composed of a material which is selected from the group consisting of ceramic, non-conducting cermet, plastic and/or composite material, where further, in particular electronic component parts may be integrated on the support.

Given a suitable choice of the material, at least one further component can be fixed on the support. This component may be an electronic circuit, in particular an integrated circuit or complete drive circuit, or one to a plurality of LEDs. A component group of this type may, in particular, be a component part of a surface lighting luminaire or lamp.

The LEDs on the support are usually arranged regularly. By way of example, they form a section or an array, with a prescribed distance (a and b) in the rows and columns, respectively. The row and column distances may, in particular, be identical.

The essential consequence of the suitable choice of the support material is the considerably reduced distance between two adjacent LEDs. It is at most 5 mm, preferably less than 2 mm.

For special applications, the support may be mounted on a further heat-dissipating material, in particular a separate thermal plate or body part of a vehicle.

In a particularly preferred embodiment, the structural height of the group is less than 10 mm, which is of considerable importance principally for surface lighting luminaires.

A further embodiment is an optoelectronic component group which is mounted on a support and which comprises at least two adjacent LEDs, which are spaced apart from one another, and also associated connecting lines. The support is composed of a material which dissipates heat well enough to realize a distance between adjacent LEDs of at most 5 mm, preferably less than 2 mm, without limiting the specified forward current of the LEDs (for example 70 mA in the case of TOPLED) and without further aids such as, for example, cooling fins.

In a particularly preferred embodiment, the support material is mounted on other heat dissipators (for example a separate thermal plate), with the result that the heat dissipation is additionally improved. This applies, in particular, when the component group is used as a rear luminaire for vehicles, in which case sheet-metal body parts can perform the function of the additional heat dissipator.

By virtue of this mounting possibility, the LEDs can now be loaded up to the uppermost limit that is physically possible, the junction temperature. On the other hand, the luminance can also be increased because the forward current $I_F$ of the LED can be increased.

A crucial advantage of the present invention is that, on the readily thermally conductive support, in particular a ceramic support, further structural parts or components can also additionally be constructed and, in particular, can even be integrated with the LEDs, in particular electronic circuits. By way of example, ceramic material is highly suitable as a basis for the integration of integrated circuits. Such circuits are required in any case for many applications; by way of example, protective circuits, monitoring functions and interfaces to bus systems are involved.

Extremely high compaction is possible as a consequence. This makes it possible for example to reduce the wiring harness in a car to one data line and one supply line. In this case, the drive circuit is concomitantly applied to the (ceramic) support.

BRIEF DESCRIPTION OF THE DRAWINGS

The invention will be explained in more detail below using a number of exemplary embodiments. In the figures.

DESCRIPTION OF THE PREFERRED EMBODIMENTS

Figure 1:
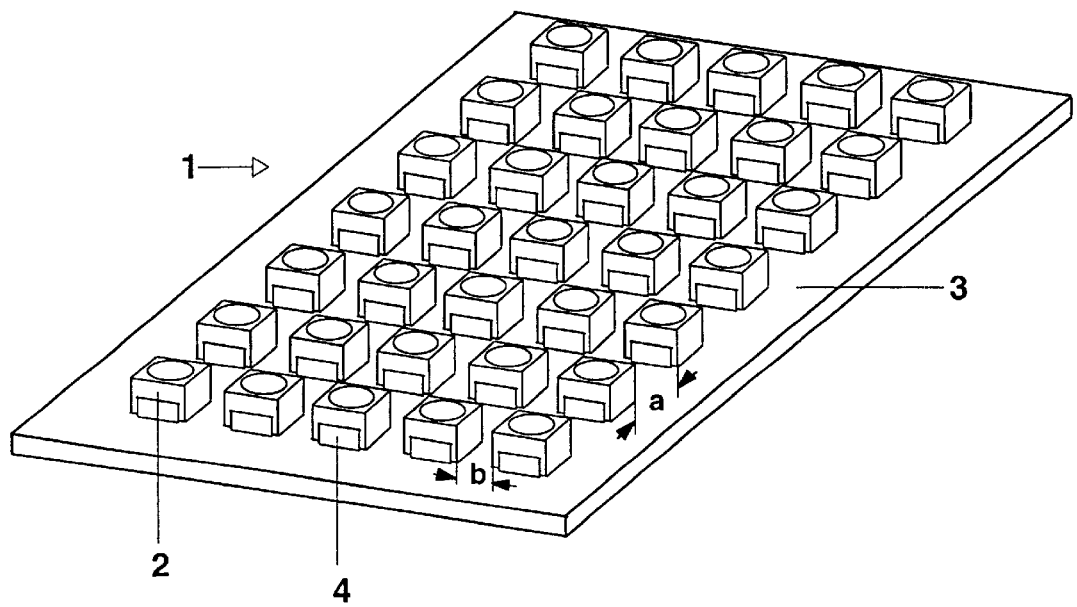
FIG. 1 shows a surface lighting luminaire with LEDs.

FIG. 1 shows a component group 1 comprising a rectangular array of white LEDs 2 which enable a surface to be illuminated homogeneously. The associated connecting lines (4) are illustrated in a greatly simplified manner. The LEDs used are forward-radiating LEDs (for example SMT TOPLED from Siemens). The common support 3 is composed for example of a ceramic material, such as aluminium oxide, or of a composite material such as HITT Plate from DENKA Chemicals. The latter material is composed of a lower layer of aluminium, a thermally conductive upper dielectric layer made of epoxy resin (typical printed circuit board material) with inorganic filling constituents and also possibly locally of a thin covering layer made of copper. The table below shows a comparison of the thermal conductivity of various substances (at 20° C.).

TABLE 1

| Material | CEM 1 (DN 9103) and FR 2 (DN 8033) | $Al_2O_3$ and AlN | HITT Plate K-1 and HITT Plate TH-1 | Quartz glass | Aluminium and Copper |
|---|---|---|---|---|---|
| Type | Printed circuit board | Ceramic | Composite material | Glass | Metal |
| Thermal conductivity (in W/K × m) | 0.26 and 0.24 | ca. 30 and ca. 170 | 1.8 and 3.5 | 0.1 | 220 and 384 |

All electrically insulating substances having a correspondingly high thermal conductivity of at least 1 W/K×m, preferably 1.5 W/K×m, in particular at least 3 W/K×m (ceramic or epoxy resin with inorganic filling material, in particular with the smallest possible porosity in each case) are suitable, but electrically conductive substances such as metals are not suitable, since short circuits would otherwise occur. In the case of composite materials, it is important that at least the surface facing the LEDs is electrically insulating (apart, possibly, from a local conductive covering layer).

The LEDs 2 are soldered onto the support, which has a rectangular basic form, using SMD technology.

Additional components such as reflectors are not required because the distance between the LEDs is only 1.5 mm on each side of the rectangular housing.

Figure 2:
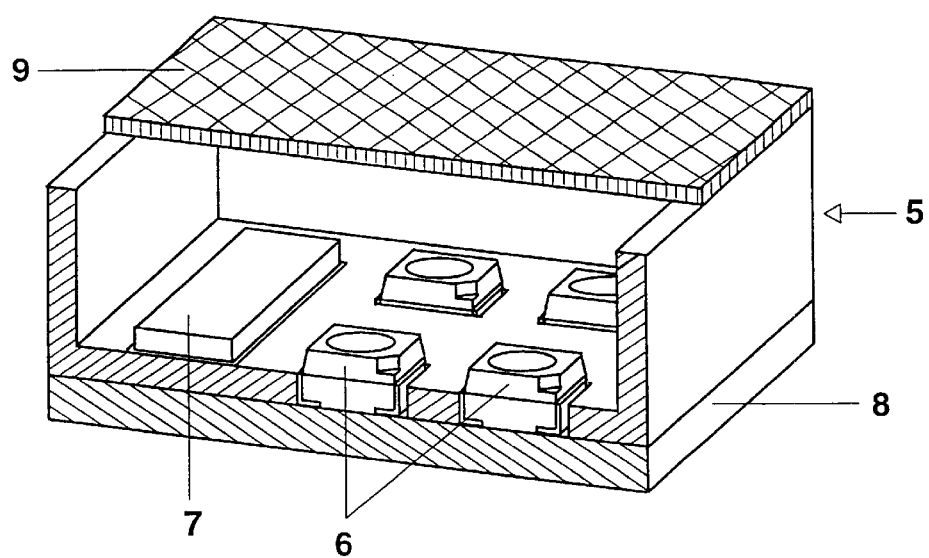
FIG. 2 shows a further exemplary embodiment of a surface lighting luminaire in which a circuit is integrated.

FIG. 2 shows a further surface lighting luminaire 5, in which, in addition to an array of LEDs 6, an integrated circuit 7 is also applied on the ceramic board forming the support 8. In order to ensure homogeneous emission in this case, the covering 9 is embodied as a diffusing screen. This luminaire has a base area of about 4×3 $cm^2$.

Owing to the narrow distance a (row distance) and b (column distance) between the LEDs, the structural height of the housing of the luminaire can be drastically reduced, to be precise by about 30 to 50%, compared with conventional technology. This is because there is approximately a linear relationship between the lateral distance and the structural height. Approximately a structural height of 15 mm has to be observed given a lateral distance of 10 mm, while the structural height can be reduced to approximately 7 mm given a distance of a=5 mm and b=4 mm.

What is claimed is:

1. An optoelectronic component group which is mounted on a support (3) and which comprises plural LEDs (2) at a prescribed distance (a) have a packing density of at least 4 LEDs per square centimeter, and associated connecting lines (4), wherein the support (3) has a thermal conductivity of at least 1.5 W/K×m.

2. The optoelectronic component group according to claim 1, wherein the support is composed of a material which is selected from the group consisting of ceramic, non-conducting cermet, plastic and composite material.

3. The optoelectronic component group according to claim 1, wherein the support is mounted on a further heat-dissipating, separate thermal plate.

4. The optoelectronic component group according to claim 1, wherein the plural LEDs (2) are arranged regularly on the support.

5. The optoelectronic component group according to claim 4, wherein the plural LEDs (2) form an array, with a prescribed distance (a and b) in the rows and columns, respectively.

6. The optoelectronic component group according to claim 1, wherein the component group is a component part of a surface lighting luminaire or lamp.

7. The optoelectronic component group according to claim 6, wherein the distance between adjacent LEDs is less than 2 mm.

8. The optoelectronic component group according to claim 6, wherein a structural height of the group is less than 10 mm.

9. The optoelectronic component group of claim 1, wherein said support has an exterior mounting surface and said plural LEDs are mounted directly on said exterior mounting surface.

10. The optoelectronic component group according to claim 9, wherein the support is composed of a material which can be populated on said exterior mounting surface by means of SMD technology.

11. The optoelectronic component group according to claim 2, further comprising electronic component parts integrated on said exterior mounting surface.

12. The optoelectronic component group according to claim 9, wherein at least one further component (7) is fixed on said exterior mounting surface.

13. The optoelectronic component group according to claim 12, wherein the further component is an integrated circuit.

14. An LED component group comprising:

a support that has a thermal conductivity of at least 1.5 W/K×m and that has an exterior mounting surface;

plural LEDs mounted directly on said exterior mounting surface, a distance between adjacent ones of said plural LEDs being no more than 5 mm, said plural LEDs having a packing density of at least 4 LEDs per square centimeter; and connections for said plural LEDs mounted directly on said exterior mounting surface.

15. The LED component group of claim 14, further comprising an integrated circuit mounted directly on said exterior mounting surface.

16. The LED component group of claim 14, wherein said support comprises a material selected from the group of materials consisting of ceramic, non-conducting cermet, plastic, and composite material.

17. The LED component group of claim 14, wherein said support has a thermal conductivity of at least 3 W/K×m.

18. An optoelectronic component group which is mounted on an exterior mounting surface of a support (3) and which comprises plural LEDs (2), which are spaced apart from one another and have a packing density of at least 4 LEDs per square centimeter, and associated connecting lines (4), wherein the support (3) dissipates heat well enough to realize a distance between adjacent LEDs of less than 2 mm, without limiting the specified forward current of the LEDs and without further aids.

* * * * *

(12) EX PARTE REEXAMINATION CERTIFICATE (8909th)
United States Patent
Biebl et al.

(10) Number: US 6,375,340 C1
(45) Certificate Issued: Mar. 20, 2012

(54) LED COMPONENT GROUP WITH HEAT DISSIPATING SUPPORT

(75) Inventors: Alois Biebl, St. Johann (DE); Guenther Hirschmann, Munich (DE)

(73) Assignee: Patent-Treuhand-Gesellschaft fuer Elektrische Gluehlampen mbH, Munich (DE)

Reexamination Request:
No. 90/011,796, Jul. 14, 2011

Reexamination Certificate for:
Patent No.: 6,375,340
Issued: Apr. 23, 2002
Appl. No.: 09/604,423
Filed: Jun. 26, 2000

(30) Foreign Application Priority Data

Jul. 8, 1999 (DE) .......................... 199 31 689

(51) Int. Cl.
*F21V 29/00* (2006.01)

(52) U.S. Cl. ............ 362/294; 257/E25.02; 257/E25.032
(58) Field of Classification Search .................. None
See application file for complete search history.

(56) References Cited

To view the complete listing of prior art documents cited during the proceeding for Reexamination Control Number 90/011,796, please refer to the USPTO's public Patent Application Information Retrieval (PAIR) system under the Display References tab.

*Primary Examiner* — Robert Nasser

(57) ABSTRACT

An optoelectronic component group has at least two LEDs (2) which are mounted on a support (3). The support is composed of a material having a thermal conductivity of better than 1.5 W/K×m, for example ceramic or composite material.

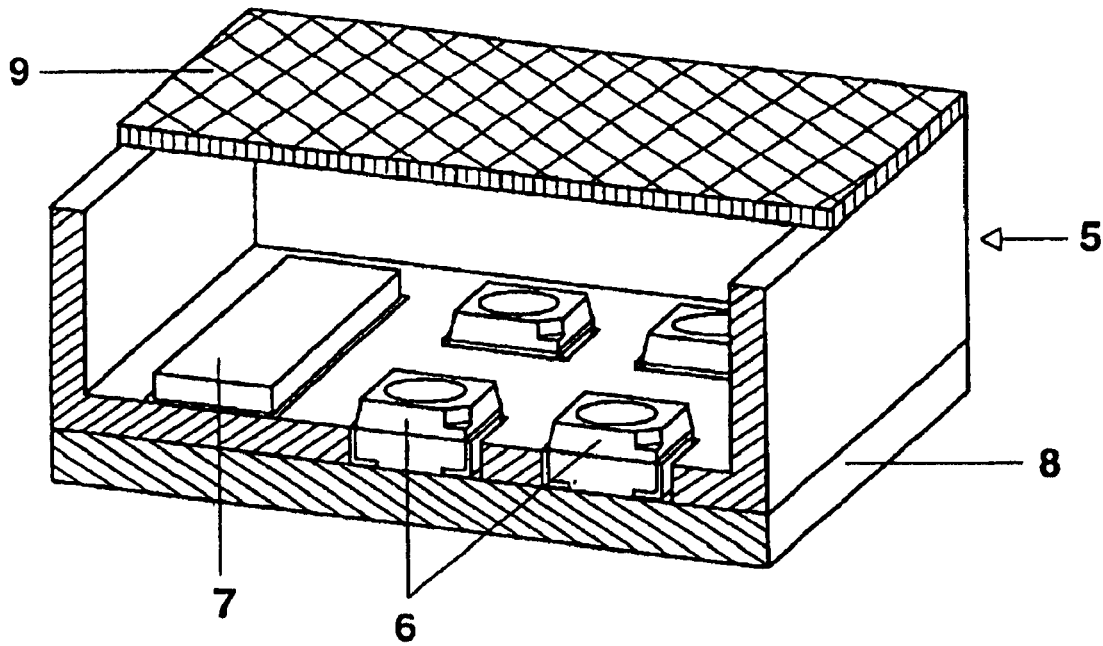

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-18 are cancelled.

* * * * *